United States Patent [19]
Ghia et al.

[11] Patent Number: 5,528,541
[45] Date of Patent: Jun. 18, 1996

[54] CHARGE SHARED PRECHARGE SCHEME TO REDUCE COMPARE OUTPUT DELAYS

[75] Inventors: Atul V. Ghia; Pradip Banerjee, both of San Jose; Patrick Chuang, Cupertino, all of Calif.

[73] Assignees: Sony Corporation of Japan; Sony Electronics, Inc., Both of, N.J.

[21] Appl. No.: 336,524

[22] Filed: Nov. 9, 1994

[51] Int. Cl.$^6$ .................................................. G11C 7/00
[52] U.S. Cl. .................... 365/203; 365/49; 365/189.07
[58] Field of Search ........................ 365/203, 49, 189.07, 365/190, 189.09, 189.11

[56] References Cited

U.S. PATENT DOCUMENTS

| | | | |
|---|---|---|---|
| 4,881,203 | 11/1989 | Watanabe et al. | 365/203 |
| 5,257,220 | 10/1993 | Shin et al. | 365/203 |
| 5,388,078 | 2/1995 | Arakawa | 365/203 |

Primary Examiner—David C. Nelms
Assistant Examiner—Vu A. Le
Attorney, Agent, or Firm—Irell & Manella

[57] ABSTRACT

The charge shared precharge circuit of the present invention is coupled to the match line. The precharge circuit is disposed between the match line and a match line, and includes a CMOS passgate having an N channel and a P channel gate. An inverter acts as a match driver and is coupled between the match and match lines at the CMOS passgate's input and output. The input to the N channel gate of the pass gate is coupled through an inverter to the input of the P channel gate. The N channel gate is further coupled to $V_{cc}$ through two serially coupled P channel transistors receive BEQ line and an SAE signal, respectively. At the beginning of a compare cycle, BEQ is driven low as is SAE, thereby turning on the serially coupled P channel transistors and coupling $V_{cc}$ to the input of the N channel gate of the passgate. The P channel gate of the passgate is also opened due to the placement of the inverter between the N and P channel gates. The passgate is thereby turned on and current passes through the passgate between the match and match lines. The opening of the passgate and the coupling of the inverter between the match and match lines, results in a shorting of $V_{cc}$ to ground. The shorting of $V_{cc}$ to ground results in a voltage precharge of the match line to $V_{cc}/2$. After a predetermined precharge time, the SAE signal is driven high thereby turning off the P channel transistor, and electrically decoupling $V_{cc}$ from the gates of the CMOS passgate and the match line. The compare circuit of the present invention then compares the bits of word A with word B, as described herein.

22 Claims, 5 Drawing Sheets

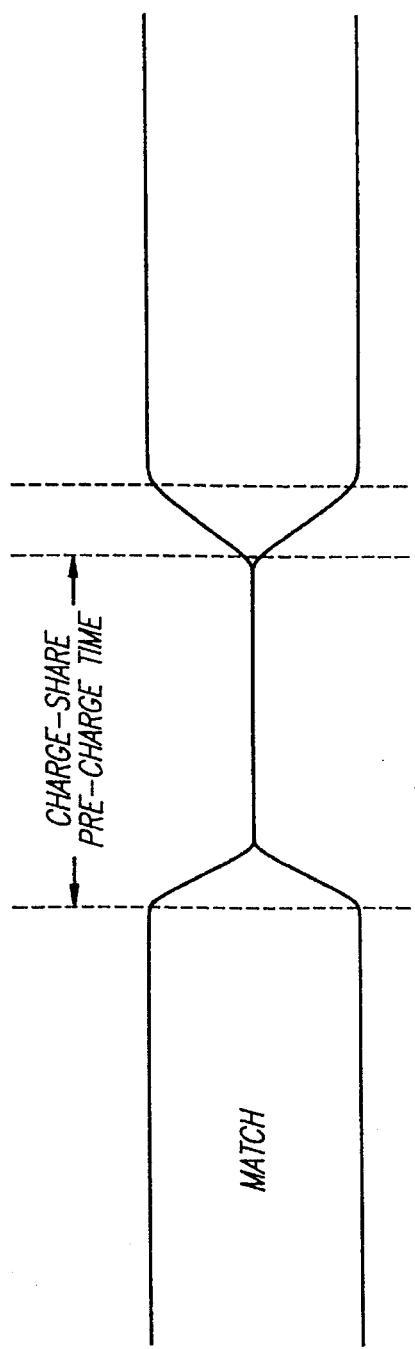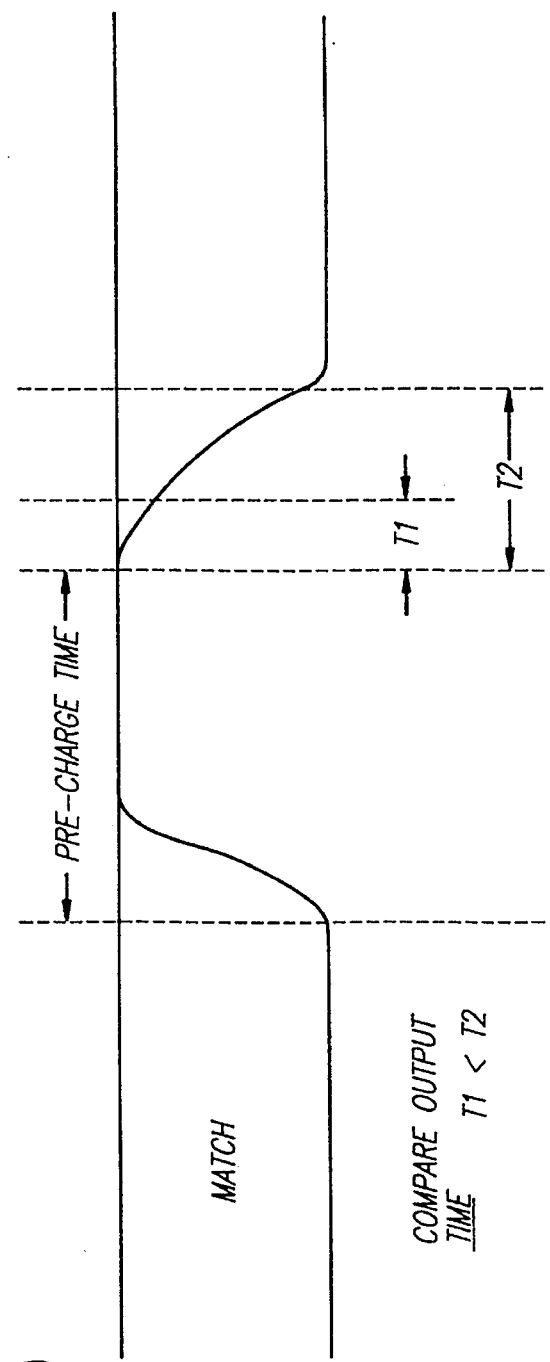

5,528,541

CHARGE SHARED PRECHARGE SCHEME TO REDUCE COMPARE OUTPUT DELAYS

BACKGROUND OF THE INVENTION

The present invention is related to U.S. patent application Ser. No. 08/336,523, filed Nov. 9, 1994, entitled "A Sense Amplifier Common Mode Dip Filter Circuit to Avoid False Misses", and Ser. No. 08/336,543, filed Nov. 9, 1994, entitled "High Performance Dynamic Compare Circuit," and hereby refers to, and incorporates by reference the content of the above referenced applications herein.

FIELD OF THE INVENTION

The present invention is related to the field of data processing systems, and more particularly, the present invention relates to electronic systems requiring the high speed comparison of data words.

ART BACKGROUND

There are many instances in modern data processing systems wherein a central processing unit (CPU) or other device must determine whether or not two data words are identically equal. For example, a comparison operation between a first and a second data word may be required in the case of a cache memory system in which data words and/or memory tags must be compared, as well as in other digital systems such as encryption devices wherein passwords and the like must be compared for an identical match. One prior art system for the comparison of two data words is illustrated in FIG. 1. As shown in the Figure, a data word A is comprised of a plurality of bits $A_0$, $A_1$, $A_2$, through $A_N$. A second data word B is comprised of bits $B_0$, $B_1$, $B_2$, through $B_N$. A bit by bit comparison is accomplished through the use of a comparator circuit, shown conceptually in FIG. 1, to determine whether each of the corresponding bits in word A and word B are identical. Using the convention that if there is an identical match between the corresponding bits of word A and word B, a logical one results, a comparison between, for example, bit $A_2$ (a logical zero) and bit $B_2$ (a logical zero) results in a comparator value of a logical one. A comparison of bit A, (a logical one) with bit B, (a logical zero) results in a comparator value of a logical zero (no match). The output from each of the compare operations is provided to a result circuit. The result circuit determines whether the comparison of each of the corresponding bits comprising word A and word B are equivalent. If word A and word B are identical, the result circuit generates a signal indicating that a match exists. If, however, as in the present example, one or more of the corresponding bits in word A and word B do not match, the result circuit generates a signal indicating that there is no match.

In some schemes, the prior art system illustrated in FIG. 1 is implemented using an architecture similar to that illustrated in FIGS. 2(a) and 2(b). As shown in FIG. 2(a), the four combinations possible for a comparison between, for example, bit $A_0$ and bit $B_0$ are shown in the Figure. The use of an exclusive NOR operation between the bit values of $A_0$ and $B_0$ provides a result $C_0$. Each of the exclusive NOR operations between the corresponding bits comprising word A and word B are exclusive "NORed" together in a tree structure. As shown in FIG. 2(b), each of the exclusive NOR operations between the corresponding bits of word A and word B are, in ram, exclusive NORed together, until a final single output is obtained resulting in the generation of either a match or a no match signal.

A disadvantage of the tree structure illustrated in FIG. 2(b) is that the propagation of the signals through the exclusive NOR tree structure is delayed by each NOR operation. Performance is degraded as a result of the inherent delays associated with the tree structure. In addition, the delay which is incurred is a function of the width of the two words which are compared. Since modern computer systems increasingly utilize longer word lengths, the time required to compare two words becomes unacceptably long and negatively impacts overall system performance.

As will be described, the present invention provides a high performance compare circuit which incurs minimal delay and may be used in high performance computer systems. The present invention utilizes a charged shared precharge scheme which overcomes the historic limitations of prior art comparison systems, such as those described above with reference to FIGS. 1 and 2.

SUMMARY OF THE INVENTION

The present invention discloses apparatus and methods for comparing the contents of two digital words and determining whether or not they identically match. The present invention's high speed compare circuit includes a plurality of bit compare block circuits (0 through N) which are coupled in a wired OR configuration to a match line. Each of the bit compare blocks receives a single bit from a first word A to be compared to a corresponding bit in a second word B. A charge share precharge circuit is coupled to the match line for precharging the match line to a voltage level of $V_{cc}/2$. A match feed back circuit is also coupled to the match line through the charge precharge circuit to improve the speed at which the match line is precharged to the voltage level of Vcc/2. A latch is coupled to the match line to electrically latch the state of the match line subsequent to the comparison operation. The comparison circuit of the present invention is dynamic and retains its high speed performance characteristics independent of the word lengths being compared.

The charge shared precharge circuit of the present invention is coupled to the match line. The precharge circuit is disposed between the match line and a match line, and includes a CMOS passgate having an N channel and a P channel gate. An inverter acts as a match driver and is coupled between the match and match lines at the CMOS passgate's input and output. The input to the N channel gate of the pass gate is coupled through an inverter to the input of the P channel gate. The N channel gate is further coupled to $V_{cc}$ through two serially coupled P channel transistors receive BEQ line and an SAE signal, respectively. At the beginning of a compare cycle, BEQ is driven low as is SAE, thereby turning on the serially coupled P channel transistors and coupling Vcc to the input of the N channel gate of the passgate. The P channel gate of the passgate is also opened due to the placement of the inverter between the N and P channel gates. The passgate is thereby turned on and current passes through the passgate between the match and match lines. The opening of the passgate and the coupling of the inverter between the match and match lines, results in a shorting of $V_{cc}$ to ground. The shorting of $V_{cc}$ to ground results in a voltage precharge of the match line to $V_{cc}/2$. After a predetermined precharge time, the SAE signal is driven high thereby turning off the P channel transistor, and electrically decoupling $V_{cc}$ from the gates of the CMOS passgate and the match line. The compare circuit of the present invention then compares the bits of word A with word B, as described herein.

Each bit compare block (0 through N) includes a compare circuit for receiving a bit and its complement from word A and a corresponding bit and its complement from word B. The compare circuit includes electrically coupled CMOS pass gates to accomplish an exclusive NOR operation between the corresponding bits. The compare circuit includes an output line which is normally maintained high to indicate that a match exists. The output line is coupled to a common mode dip filter which is comprised of N and P channel devices. The output line of the compare circuit is coupled to the gates of a first and a second P channel transistor. The first P channel transistor is coupled to $V_{cc}$, and the second P channel transistor is coupled in series to the first P channel transistor. The output line from the compare circuit is also coupled to the gate of an N channel transistor coupled in series with the first and second P channel transistors. The N channel transistor is also coupled to ground. A third P channel transistor is electrically coupled between the first and the second P channel transistors and to ground. A dip filter output line (referred to herein as "compare out") is coupled between the second P channel transistor and the N channel transistor, as well as to the gate of the third P channel transistor.

In operation, the common mode dip filter of the present invention filters relatively short duration voltage dips from the output of the compare circuit. These transient voltage dips may be generated through the use of, for example, sense amplifiers to sense memory locations to retrieve words to be compared by the present invention. The normally high output line from the compare circuit may dip low as a result of transient voltage swings generated from electrical characteristics of sense amplifiers. The common mode dip filter of the present invention requires that the output line of the compare circuit be driven low in more than a transient manner in order to drive the normally low compare out line of the common mode dip filter to a high state.

The compare out line of the common mode dip filter is coupled to the gate of an N channel transistor in a wired OR circuit. The N channel transistor of the wired OR circuit is coupled between the match line and ground. Since the normal state of the compare out line is low, thereby indicating that match exists, the N channel transistor in the wired OR circuit is normally off and not conducting current. However, if the compare out line is driven high, indicating a no match, the N channel transistor in the wired OR circuit is mined on thereby coupling the match line to ground. Thus, a no match condition in any one of the bit compare circuits will result in the match line being driven to ground. The performance of the present invention is thereby not affected by the number of bits compared, since the comparison is done simultaneously on a bit-by-bit basis by each of the bit compare block coupled to the match line.

BRIEF DESCRIPTION OF DRAWINGS

FIGS. 4(a) and 4(b) illustrate the concept of charge shared preconditioning of the match line utilized by the present invention.

DETAILED DESCRIPTION OF THE INVENTION

The present invention discloses apparatus and methods for comparing the contents of two digital words and determining whether or not they identically match. The present invention has broad application in computer systems, and in particular computer systems which require the comparison of a first word read from a memory device with a second word provided by a separate digital element of the system. In the following description, numerous specific details are set forth such as electronic components, data paths, devices, etc., in order to provide a thorough understanding of the present invention. However, it will be apparent to one skilled in the art that the present invention may be practiced without these specific details. In other instances, well known circuits and structures are not described in detail in order not to obscure the present invention unnecessarily.

Although the present invention has broad application in data processing systems requiring the comparison of two binary words, certain aspects of the present invention will be described using terms which represents signals and structures found in the presently preferred embodiment in which the invention is used. For example, in its current form, the present invention compares a data word which is provided to the compare circuit of the present invention with a data word which is sensed from a memory cell. As such, the sensing of the memory cell is accomplished utilizing sense amplifiers. One natural characteristic of a sense amplifier is that prior to the sensed information settling on a line there may be a dip in the voltage level. As will be described, the present invention provides an apparatus and method for negating this natural dip associated with a sense amplifier's output. Although the present invention utilizes sense amplifiers for sensing the content of a memory device to obtain one of the words for comparison, it will be appreciated by one skilled in the art that the present invention is not limited to the use of sense amplifiers. However, for purposes of completeness and clarity, the present invention will be described in the context of a system which utilizes sense amplifiers to obtain one of the binary words to be compared.

Figure 2A:
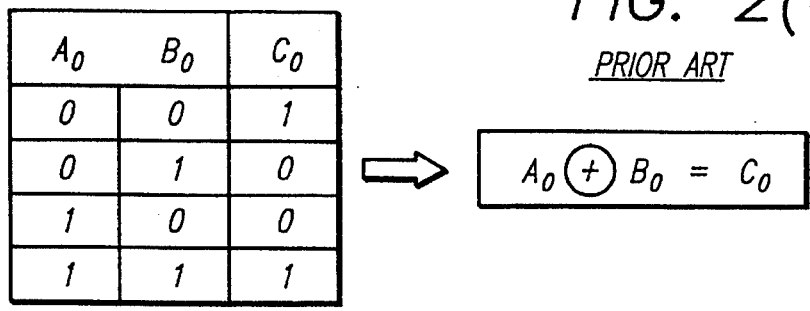
FIG. 2(a) illustrates a truth table of bit $A_0$ of word A and bit $B_0$ of word B, and the corresponding result $C_0$ of an exclusive NOR operation between $A_0$ and $B_0$.
Figure 2B:
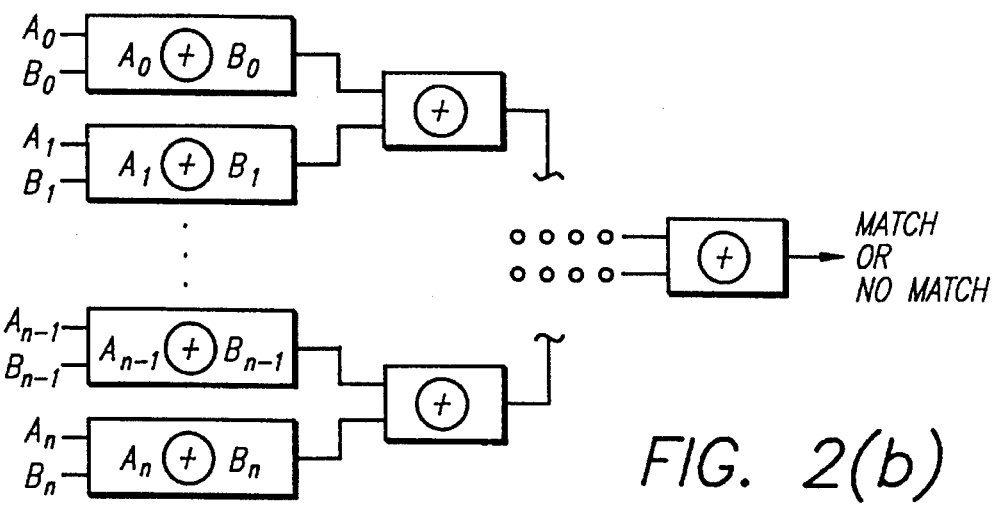
FIG. 2(b) illustrates a prior art static tree structure for an exclusive NOR operation between corresponding bits of a first data word A and a second data word B.
Figure 3:
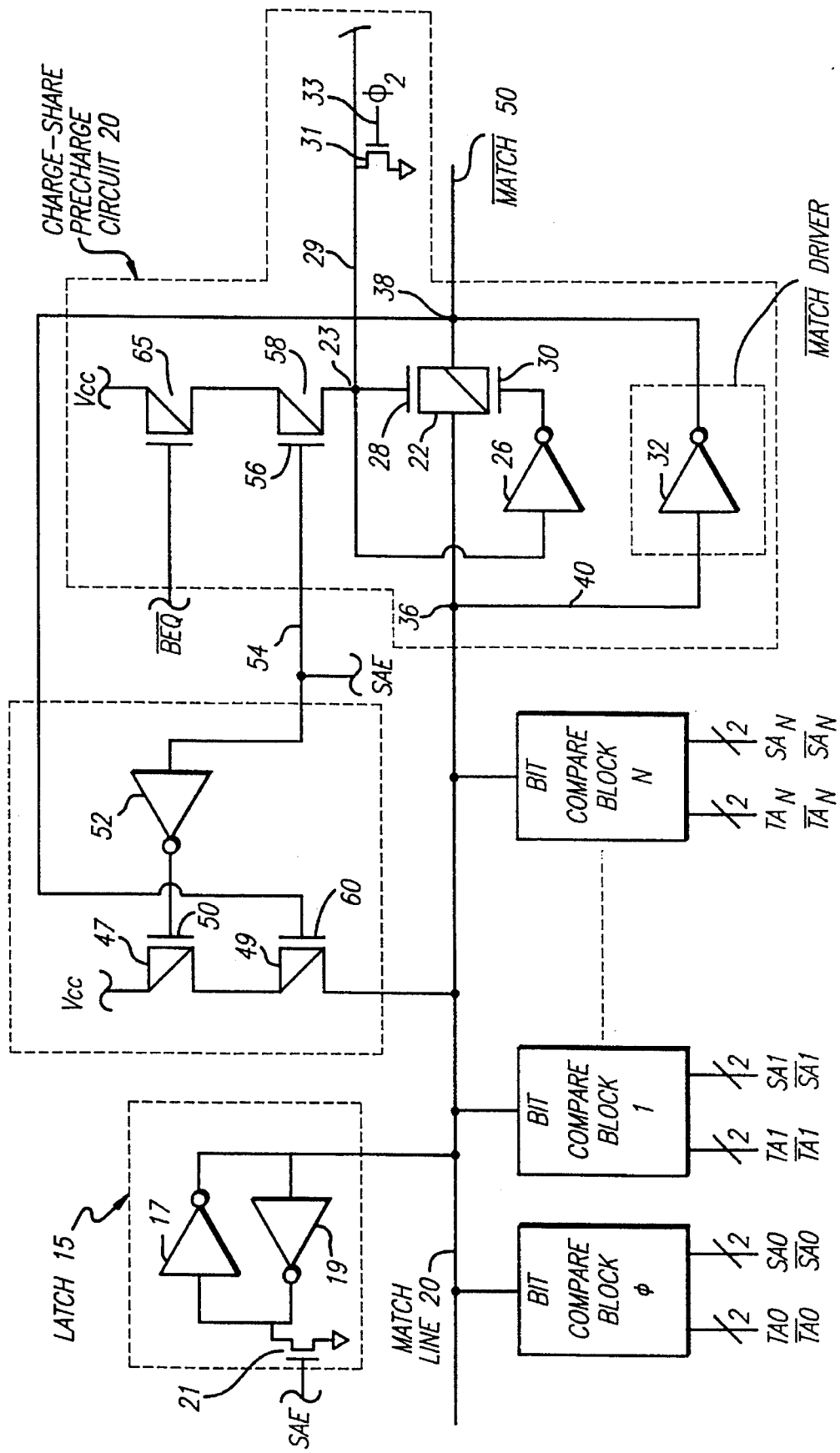
FIG. 3 illustrates the dynamic compare circuitry of the present invention.

Referring now to FIG. 3, the comparison circuit of present invention includes a match line 20. Bit compare blocks 0 through N are coupled to the match line 20 as shown in the Figure. As will be described more fully below, each of the bit compare blocks compares the corresponding bits between a word A and a word B. In this Specification, each of the bit compare blocks compares a bit identified as "TA" for word A, with a bit identified as "SA" for a word B. In the present implementation of the invention, the compare circuit disclosed herein compares a cache memory tag (TA) bit with a sensed cache memory location bit (SA). In the present implementation, SAE represents an abbreviation for a sense amplifier enable signal, and BEQ represents an abbreviation for a bit line equalizer signal. These signals represent clock signals generated by a circuit (not shown) internal to the semiconductor device in which a present implementation of the invention is utilized. However, it will be appreciated that although the terms SAE and BEQ are used herein, the signals may be given any one of a variety of names, so long as the function and operation of the signals is as provided in this Specification. Each of the bit compare blocks (0 through N) are coupled directly to the match line 20 in a wired OR connection. The bit compare block circuitry of the present invention is dynamic, rather than static, and as such, the speed of comparison of the bits is independent of word length and hereby provides significant system performance improvement over prior art systems such as that illustrated in FIGS. 2(a) and 2(b).

A latch 15 is coupled to the match line 20 to latch the final result of the compare operations of the bit compare block. The latch 15 includes serially coupled inverters 17 and 19. An N channel transistor 21 is coupled to the output of inverter 19 and ground. The gate of transistor 21 is coupled to SAE. In the presently preferred embodiment, the match line 20 is precharged by a charged shared precharge circuit 20, The charge share precharge circuit 20 includes a CMOS passgate 22 coupled to match line 20. The CMOS passgate 22 includes both N channel and P channel devices, and is constructed utilizing CMOS technology. The CMOS passgate 22 includes N channel gate 28 and P channel gate 30. As is known, the application of voltage ($V_{cc}$) to gate 28 turns N channel gate "on." As illustrated, an inverter 26 is coupled between gates 28 and 30 of the CMOS passgate 22. It will thus be appreciated that the application of $V_{cc}$ to a node 23 results in CMOS passgate 22 being turned on. In addition, an inverter 32 is also coupled between a node 36 and a node 38, as illustrated in FIG. 3. In the event the CMOS passgate 22 is on, current passes through the passgate between the match line 20 and a match line 50, and node 36 and node 38 are thereby electrically shorted.

The coupling of inverter 32 between nodes 36 and 38 results in the shorting of $V_{cc}$ to ground. In the presently preferred embodiment, the device size of inverter 32 is relatively small, thereby minimizing the current passing Over line 40 coupling node 36 to node 38 through the inverter 32. As will be appreciated by one skilled on the art, the shorting of $V_{cc}$ to ground results in a voltage over match line 20 of $V_{cc}/2$, which corresponds to the trip point of the inverter 32. Thus, in accordance with the teachings of the present invention, the match line 20 is thereby precharged to $V_{cc}/2$. The inverter 32 acts as a driver for a match signal, thereby permitting the match line 50 to be more heavily loaded than the match line 20.

The present invention further includes a match feedback circuit 45 which is coupled to the charge share precharge circuit 20 as illustrated in FIG. 3. The match feedback circuit 45 further enhances the performance of the present invention by speeding up the process of charging up the match line 20 during a match hit. As shown, the match feedback circuit 45 includes a P channel transistor 47 coupled to Vcc. The transistor 47 is coupled in series to a second P channel transistor 49, which is in turn coupled to the match line 20. The gate 50 of transistor 47 is coupled to an inverter 52 for receipt of a signal referred to in this Specification as SAE over a line 54. Line 54 is also coupled to the gate 56 of a P channel transistor 58 in the charge share precharge circuit 20. Similarly, the gate 60 of transistor 49 is coupled to the match line 50 at node 38. As shown, a P channel transistor 65 is coupled to $V_{cc}$ in the charge share precharge circuit 20, the gate of transistor 65 being coupled to receive a signal referred to as BEQ. The operation of the charge share precharge circuit 20 and the match feedback circuit 45 will be described more fully below.

In operation, each of the bit compare blocks (0 through N) compare one bit of word A with a corresponding bit of a second word B. As previously noted, each of the bit compare blocks (0 through N) are coupled to the match line 20 in a wired OR configuration. The match line 20 is precharged to a $V_{cc}/2$ level. At the beginning of a compare cycle, the BEQ signal is driven low, thereby turning the P channel transistor 65 on to permit current to flow from $V_{cc}$. Similarly, at the beginning of a compare cycle, the SAE signal is maintained low, and is coupled to line 54 thereby turning on P channel transistor 58 to permit $V_{cc}$ to pass through that device. As will be appreciated from the illustration of FIG. 3, if transistors 65 and 58 are on, the gate 28 of the CMOS pass gate 22 is also opened as is gate 30. During this period of pre-charge the low SAE signal is inverted by the inventor 52 to turn gate 50 and transistor 47 "off," thereby not permitting current ($V_{cc}$) to pass there through in the feedback circuit 45. Thus, the match line 20 and the match line 50 are charge shared and precharged to a voltage level of $V_{cc}/2$. As illustrated in FIG. 3, a line 29 is coupled to node 23. Line 29 is further coupled to an N channel transistor 31 which is coupled to ground. The gate of transistor 31 is coupled to a clock ($\varnothing_2$). During the period of charge shared precharge time, clock $\varnothing_2$ is low thereby turning off transistor 31. In the present embodiment, clock $\varnothing_2$ goes high after the match output is valid (see FIG. 5). A high clock results in transistor 31 being turned on, thereby decoupling match line 20 and match 50.

Figure 1:
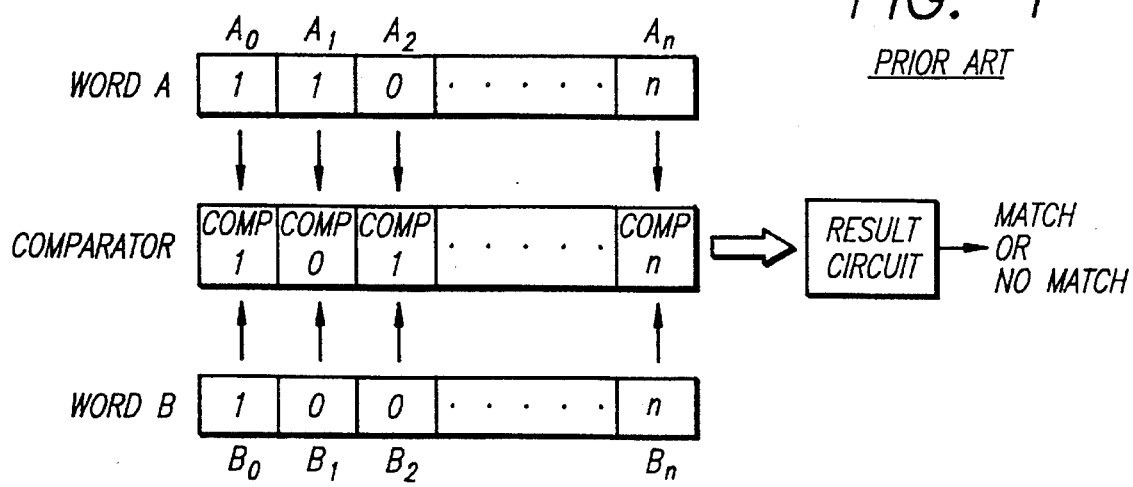
FIG. 1 conceptionally illustrates a prior art bit by bit comparison of two binary words.

The present invention utilizes the concept of charge sharing and precharging of the match line 20 to increase system performance. Referring briefly to FIG. 4, the present invention's concept of charge shared preconditioning of the match line 20 is shown. FIG. 4(b) illustrates the case where a match line, such as for example, the match line of the prior art system illustrated in FIG. 1, is precharged to a voltage level of $V_{cc}$. In the event of a match (or depending upon the logic configuration a "no match"), the result of the compare operation must pull the precharged match line voltage level to ground. The time required to precharge the match line and then to discharge the line to ground degrades system performance. In comparison, the present invention's charge share preconditioning of the match line is illustrated in FIG. 4(a). By precharging match line 20 to $V_{cc}/2$, the time required to either pull the match line to $V_{cc}$, or to discharge the match line 20 to ground (depending on the logic convention selected), is less than the case illustrated with reference to FIG. 4(b). In other words, the performance of the compare circuit of the present invention is increased because, as illustrated in FIGS. 4(a) and 4(b), $T_1$ is less than $T_2$, where $T_1$ is equal to the time required to either pull the match line 20 up to the $V_{cc}$, or alternatively, to discharge the match line from $V_{cc}/2$ to ground using the present invention's charge shared precharge conditioning. In the illustration, $T_2$ is equal to the time required to discharge the match line from $V_{cc}$ to ground.

Figure 5:
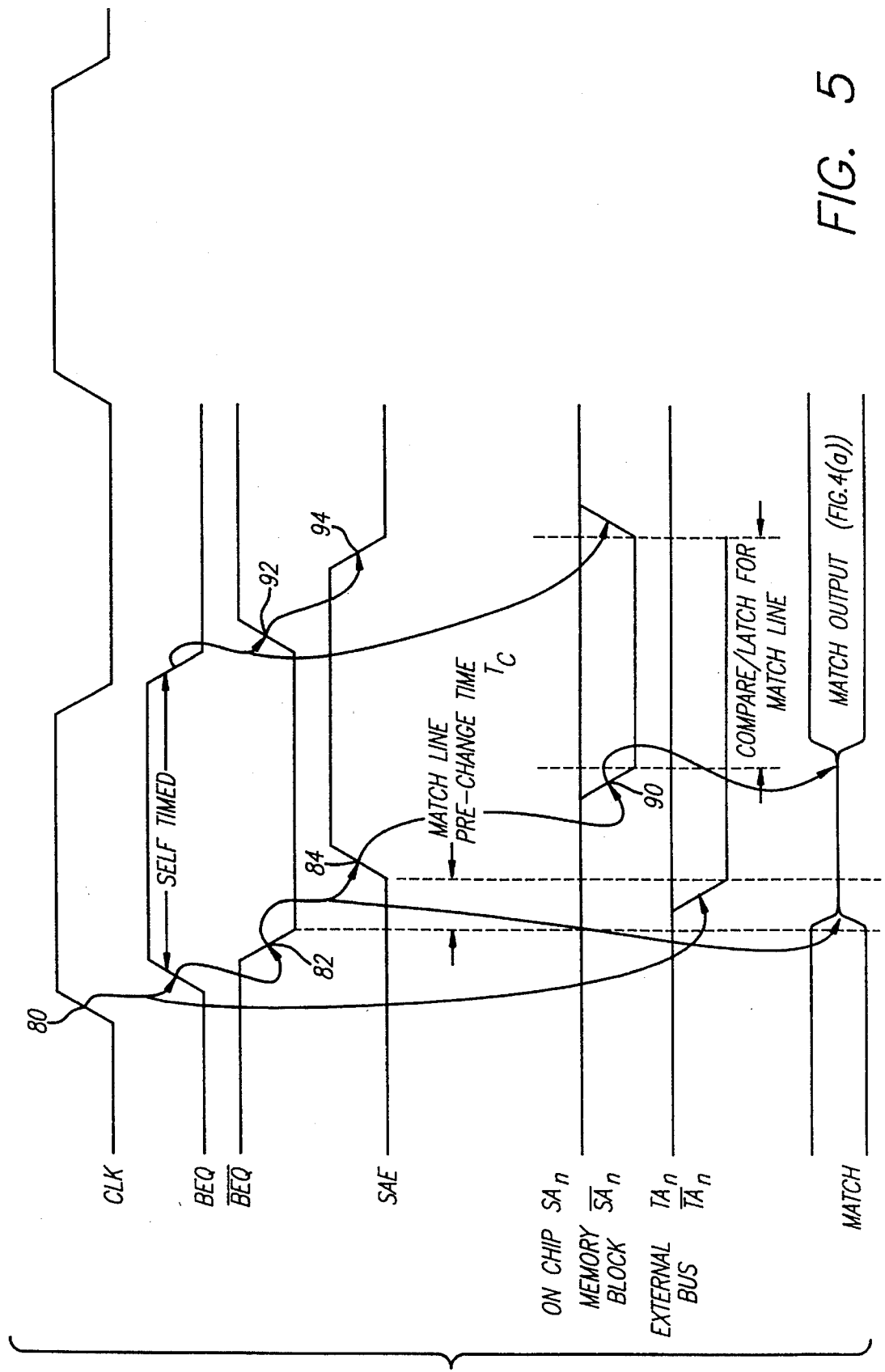
FIG. 5 is a timing diagram of the compare and match circuitry operations of the present invention.

Referring once again to FIG. 3, in conjunction with the timing diagram of FIG. 5, the operation of the present invention will be described in further detail. In FIG. 5, a clock signal (Clk) is provided to the system of the present invention. The clock signal may be generated from an internal or external clock source. At the beginning of a compare cycle, the rising edge of the clock signal (80) results in the generation of a BEQ signal driven "high", and a corresponding BEQsignal driven low (identified by the numeral 82). The BEQsignal is followed after a predefined time $T_c$ by the generation of an SAE signal driven high (numeral 84). With reference to FIG. 3, as previously described transistors 47 and 49 are P channel devices, such that the transistors are "on" when there is no voltage at the gates 50 and 60, respectively. In order for transistor 47 to pass current, the voltage at gate 50 must be low ($V_{ss}$).

Similarly, in order for transistor 49 to pass current, the voltage at gate 60 must be low ($V_{ss}$) as well. In comparison, CMOS passgate 22 includes N channel gate 28 which is on when $V_{cc}$ is provided to the gate 28. In order for gate 28 to be on, transistor 65 and transistor 58 must also be on since they are coupled to $V_{cc}$.

It will be appreciated that since transistors 65 and 58 are P channel devices, BEQ and line 54 which is coupled to SAE must be low in order for $V_{cc}$ to be coupled to gate 28, and thereby precharge match line 20. As best shown in FIG. 5, the time period between signal BEQ driven low and signal SAE driven high corresponds to the match line precharge time ($T_c$) of the present invention. The match line precharge time ($T_c$) is the time period during which match line 20 is precharged to $V_{cc}/2$. As will be appreciated from the figures, upon signal SAE being driven high, gate 56 of transistor 58 is closed thereby preventing current from passing through transistor 58 and not providing a $V_{cc}$ voltage to gate 28. Consequently, upon signal SAE being driven high, the transistor 58 is shut off, as is gate 28 thereby preventing further precharging of the match line 20. The timing for driving the SAE signal high thus terminating the $T_c$ time is a matter of design choice based on design considerations. For purposes of this description, the mechanism employed by the present invention for the generation of signals BEQ, BEQand SAE are not described in further detail. A consideration in the implementation of the present invention is that the match line precharge time ($T_c$) be sufficient to accomplish the precharging of match line 20 to $V_{cc}/2$.

As illustrated in FIG. 5, as the SAE signal is driven high (84), the match line precharge is terminated and the bits from a first word (SA) are coupled to the bit compare blocks 0 through N. In the presently preferred embodiment of the invention, the bits comprising word B to be compared (bits $SA_0$ through $SA_N$) originate from an on chip memory block. Similarly, bits comprising word A to be compared with the bits for word B are coupled in the present embodiment from an external bus to the bit compare blocks 0 through N. Using the convention in this specification, the bits of word A (bits $TA_0$ through $TA_N$) are compared with the corresponding bits of word B (bits $SA_0$ through $SA_N$). As shown in the timing diagram of FIG. 5, the bits of word A ($TA_0$ through $TA_N$) are coupled to each of the bit compare blocks prior to the completion of the precharge of the match line 20. The bits of word B are coupled to the bit compare blocks upon the termination of the match line precharge time as a result of the SAE signal going high (84). The timing for providing the bits of word B to the bit compare blocks is designed to permit sufficient time for the match line 20 to be precharged. In addition, as will be described, the present invention's bit compare blocks include circuitry which compensates for natural voltage dips in sense lines due to the electrical characteristics of sense amplifiers. In the current implementation, the signal SAE corresponds to a sense amplifier enable signal which is coupled to a cache memory for reading a memory location to be compared to an externally provided tag word. However, it will be appreciated that the operation and performance advantages taught by the present invention have application far beyond the current implementation.

Continuing to refer to FIG. 5, the bit compare block 0 through N compare the bits comprising word A (bits $TA_0$ through $TA_N$) with the bits comprising word B (bits $SA_0$ through $SA_N$) upon receipt of the bits comprising word B. As illustrated in the timing diagram, the coupling of bits $SA_0$ through $SA_N$ to the bit compare circuits (see point 90) results in the match output of the present invention on match line 20. The state of the match line 20 is latched by the latch 15. It will be noted that during the compare/latch period when the match output is sensed, the charge share precharge circuit 20 electrically disconnects match line 20 from match line 50. The rising edge of the BEQ signal (identified as numeral 92) results in the turning off of transistor 65 thereby not permitting current to pass through the device. Similarly, the rising edge of BEQ (92) is followed by the SAE signal being driven low (indicated by the numeral 94). A low SAE signal results in the opening of the gate 56 of transistor 58, turning transistor 58 on, and the closing of gate 50 thereby turning transistor 47 off. Since BEQ is high, transistor 65 is turned off and $V_{cc}$ is not coupled through transistor 65 to the transistor 58. Thus, a high signal at gate 50 of the transistor 47 results in the transistor 47 being "off" and not permitting $V_{cc}$ to pass therethrough. Accordingly, during the period in which the match output is provided by the bit compare block 0 through N and latched on match line 20, match line 20 is electrically disconnected from match line 50.

Continuing to refer to FIG. 3 in conjunction with FIG. 5, during the compare/latch period for the match line 20, the latch 15 maintains the state (match or no match) of the match line 20. This state is inverted by the inverter 32 which also acts as a match driver. This driver boosts the match line 20 in the event match line 20 has a hit by providing feedback into the gate of transistor 49.

Figure 6:
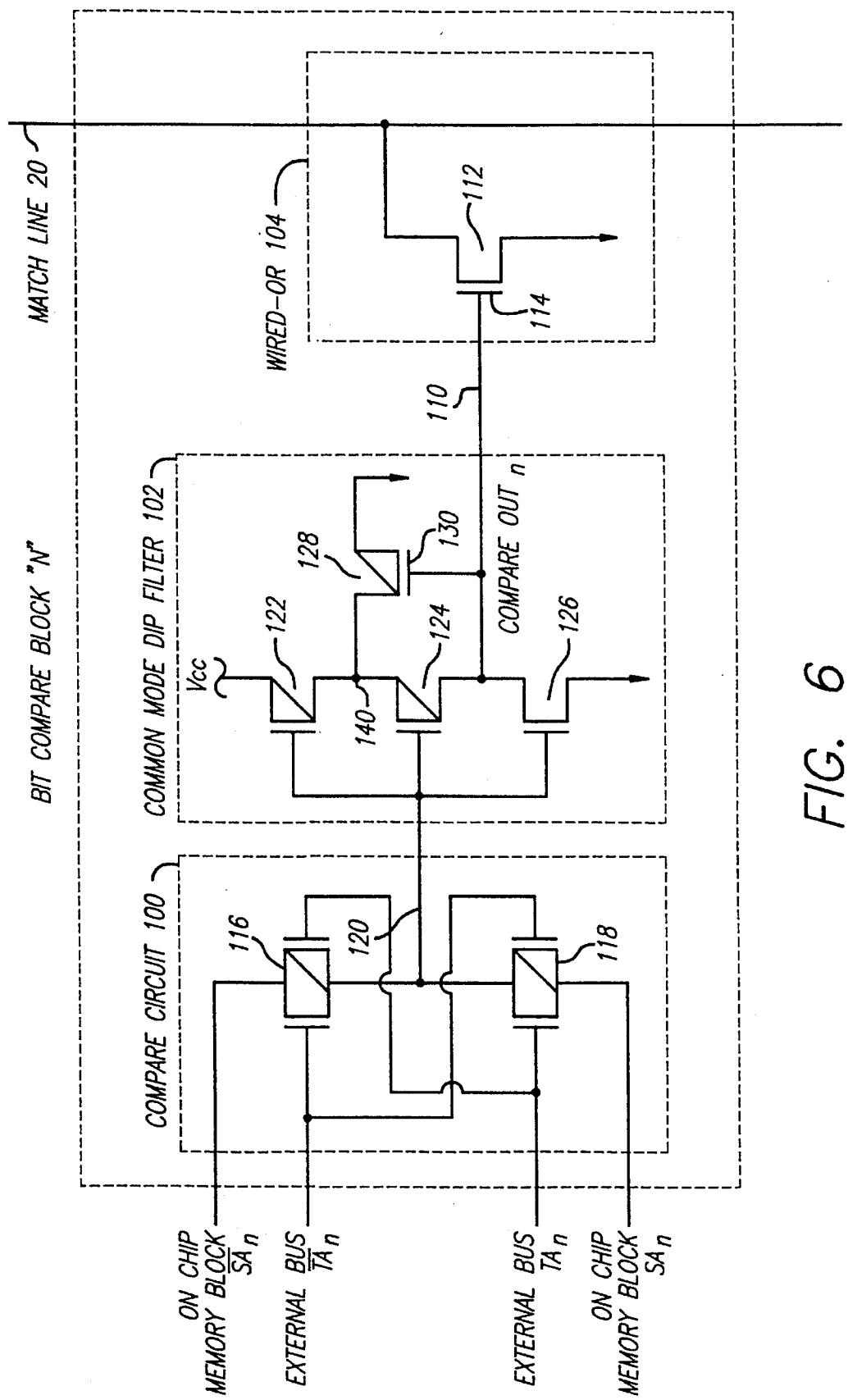
FIG. 6 illustrates the compare block circuitry of the present invention for comparing two binary quantities.

Referring to FIG. 6, the bit compare block circuitry of the present invention will be described with reference to an exemplary bit compare block (N). As shown, the bit compare block N includes a compare circuit 100, a common mode dip filter circuit 102, and a wired OR circuit 104. The compare circuit 100 effectively comprises an exclusive NOR gate which is provided with bit As and bit $B_N$ for comparison. Consistent with the syntax set forth in this description, and previously discussed with reference to FIG. 3, the bits $A_N$ and $B_N$ are denoted as $TA_{N1}$, $\overline{TA_{N1}}$, $\overline{SA_N}$ and $SA_N$. The value of $\overline{SA_N}$ and $SA_N$ is provided in the present embodiment, from an on chip memory block (not shown). The values of $TA_N$ and $\overline{TA_n}$ are provided from an external bus (not shown).

The output of the compare circuit 100 is coupled to the input of the common mode dip filter 102 by a line 120. It has been found that if word A and word B comprise static words, such that it is not necessary to retrieve either of those words from memory, a designer may choose not to include the common mode dip filter 102 in the bit compare block circuitry. As will be described, the common mode dip filter 102 avoids the spurious generation of ambiguous compare results, by filtering out undesirable voltage dips generated through the use of sense amplifiers to sense the contents of memory. As previously noted, the presently preferred embodiment utilizes sense amplifiers to sense a cache memory and to provide the output of the memory as bit SAw (and its inverted value $\overline{SA_N}$) to the compare circuit 100, for comparison with a static bit value coupled from an external bus ($TA_N$ and $\overline{TA_N}$).

Continuing to refer to FIG. 6, present invention is coupled to the wired OR circuit 104 by a compare out line 110. The output of the common mode dip filter 102 is normally maintained in a low state, thereby indicating a match has occurred. The wired OR circuit 104 includes an N channel transistor 112 having a gate 114 which is turned on by line 110 being driven high. If the state of line 110 remains low, the transistor 112 remains off. In the event that a single bit in any of the bit compare blocks (0 through N) does not match, the line 110 in the non-matching bit compare circuit is driven high, thereby opening gate 114 and turning on N channel transistor 112. If transistor 112 is on, the precharge voltage $V_{cc}/2$ on the match line 20 is pulled to ground.

For the sake of example, assume $\overline{TA_N}$ is high (and consequently $TA_N$ is low). A CMOS passgate 116 in the compare circuit 100 is turned on and the corresponding CMOS passgate 118 is turned off. In the compare circuit 100 illustrated in FIG. 6, if either the CMOS passgate 116 or the CMOS passgate 118 is on, the other is necessarily turned off. If $\overline{SA_N}$ is high and $\overline{TA_N}$ is high, then CMOS passgate 116 is on thereby resulting in line 120 being driven high. Conversely, if $\overline{SA_N}$ is low and $\overline{TA_N}$ is high, line 120 will remain low since the CMOS passgate 118 is turned off.

The present invention's use of sense amplifiers to sense memory locations to provide the $SA_N$ and $\overline{SA_N}$ signals are high at the beginning of a cycle and result in a condition where both $\overline{SA_N}$ and $SA_N$ dip simultaneously low. The condition where $\overline{SA_N}$ and $SA_N$ dip simultaneously low is due to the analog nature of the signals, and the electrical characteristics of sense amplifiers. It will be appreciated that if $SA_N$ and $\overline{SA_N}$ dip low, line 120 will go low regardless of the state of $\overline{TA_N}$ or TAN. The condition where $\overline{SA_N}$ and $SA_N$ dip simultaneously low is a transitory dip where the voltage along line 120 dips low which could result in a false high signal over line 110 indicating a no match condition on the match line 20. To compensate for the possibility of the sense amplifier's electrical transitory dips causing a false result, the common mode dip filter 102 is coupled with the output of the compare circuit 100 over output line 120.

As illustrated, the common mode dip filter includes a P channel transistor 122 coupled to $V_{cc}$, and as shown, an additional P channel transistor 128 is coupled between transistors 122 and 124 to ground. The gate 130 of P channel transistor 128 is coupled to the compare output line 110. In addition, an N channel transistor 126 is coupled to line 120 as illustrated. In operation, if line 120 is remains high, P channel transistors 122 and 124 remain off and N channel transistor 126 remains on. If transistor 126 is on, the compare out line 110 is coupled to ground. Alternatively, if line 120 is driven low, P channel transistors 122 and 124 are turned on, thereby coupling $V_{cc}$ to the compare out line 110 and driving the compare out line 110 high. As previously noted, driving the compare out line 110 high turns on transistor 112 in the wired OR circuit 104 and pulls the match line 20 to ground.

It will be appreciated that a temporary dip in the voltage level of 120 resulting from, for example, a sense amplifier voltage dip, does not result in a change of state in the compare outline 110. The output of line 120 is filtered through the placement of P channel transistor 128 between P channel transistors 122, 124 and ground. In the event that line 120 dips low, a node 140 is pulled high by $V_{cc}$ and is simultaneously pulled low through transistor 128 to ground. In the absence of transistor 128, a low state of line 120 would result in N channel transistor 126 turning off, and P channel transistors 122 and 124 turning on, thereby pulling the compare outline 110 to high and generating a faire "no match". However, since the compare out line 110 is coupled to gate 130 of the P channel transistor 128, a high state at gate 130 results in transistor 128 turning off. Thus, there is a coupling between $V_{cc}$ and ground resulting in a loss of power, and a filtering of short time duration voltage dips over line 120. In order to change the state of compare outline 110 it is necessary for line 120 to be driven low in a solid manner to force the compare outline 110 to be driven high. Relatively small variations in the voltage level over line 120 will not result in the compare out line 110 being driven high, thereby avoiding in spurious false signals to the wired OR circuit 104.

It will be further noted that since the match line 20 is precharged to $V_{cc}/2$, in the event that all bit compare blocks 0 through N indicate a "match", the match line 20 will charge to $V_{cc}$ through match feedback circuit 45. SAE going high raises the match line 20 level slightly above the trip point of inverter 32. In the event of a "match", inverter 32 drives node 38 low which in turns transistor 49 on, thereby charging match line 20 to $V_{cc}$. However, if any one of the compare out lines (line 110 in FIG. 6) in any of the bit compare blocks are driven high, thereby indicating that a no match condition occurs, the transistor corresponding to transistor 112 is turned on, thereby driving the state of the match line 20 to ground. Accordingly, the present invention's dynamic compare circuit as described herein is independent of the word size being compared. Since a comparison of the corresponding bits between word A and word B is accomplished simultaneously and independent of one another, the bit length of words A and B are not a factor in determining the speed of the comparison operation. If any one of the bits (0 through N) do not match between the compared words, the match line 20 is pulled low. The state of the match line 20 is then latched by latch 15, and the inverted state of the match line (match) is provided as an output on match line 50.

As disclosed herein, the present invention provides an improved high performance comparison circuit. The comparison circuit of the present invention includes a charge share precharge circuit and a match feedback circuit for providing a very high speed precharge to a match line. Moreover, the present invention provides one bit compare block for each bit to be compared. Each bit compare block includes a compare circuit coupled to a common mode dip filter. The common mode dip filter filters out unwanted transient voltage variations which may be generated through the use of, for example, sense amplifiers to sense the condition of memory elements. The common mode dip filter provides a compare output signal to a wired OR circuit, which is in turn coupled to the match line 20. Although the present invention has been described with reference to FIGS. 1 through 6, it will be appreciated that the present invention may be utilized in a variety of systems where high speed comparison of bits is required. The description herein with reference to the figures will be understood to describe the present invention in sufficient detail to enable one skilled in the art to utilize the present invention in a variety of applications and system environments.

We claim:

1. A precharge circuit, comprising:

a first line;

match feedback circuit means coupled to said first line;

a second line;

inverter means coupled between a first node on said first line and a second node of said second line;

passgate means coupled between said first and second lines, said passgate means electrically coupling said first and second lines in the event $V_{cc}$ is provided to gate means of said passgate;

first transistor means coupled between said gate means of said passgate and $V_{cc}$ for providing said $V_{cc}$ voltage to said gate means of said passgate upon the application of a signal to said first transistor means;

the application of $V_{cc}$ to said gate means of said passgate means resulting in said passgate electrically coupling said first and second lines together, and shorting $V_{cc}$ to ground, thereby precharging said first line to a voltage level of $V_{cc}/2$, which is a trip point of the said inverter means.

2. The circuit as defined by claim 1 wherein said match feedback circuit means includes second transistor means coupled between $V_{cc}$ and said first line.

3. The circuit as defined by claim 2 wherein said first transistor means includes a first and a second P channel transistor, said first P channel transistor having a first gate, and said second P channel transistor having a second gate.

4. The circuit as defined by claim 3 wherein said signal is comprised of an SAE signal applied to said second gate and a BEQ signal applied to said first gate.

5. The circuit as defined by claim 4 wherein said match feedback circuit means includes a third and a forth P channel transistor coupled between $V_{cc}$ and said first line, said third and forth P channel transistors including third and forth gates, respectively.

6. The circuit as defined by claim 5 wherein said forth gate is coupled to said second line and said third gate is coupled to receive an inverted voltage value of said SAE signal.

7. The circuit as defined by claim 6 further including a plurality of bit compare-circuits coupled to said first line, each of said bit compare circuits receiving a bit from a first data word and a corresponding bit from a second data word to compare, each of said bit compare circuits comparing said bits in parallel with one another and providing an output to said first line, such that if all of said bits identically match said first line remains at said precharged state of $V_{cc}/2$.

8. The circuit as defined by claim 7 wherein in the event any one of said bits do not match said first line is pulled to ground.

9. The circuit as defined by claim 8 wherein each of said bit compare circuits are coupled to said first line in a wired OR configuration.

10. The circuit as defined by claim 9 further including latching means coupled to said first line for latching the voltage state of said first line after the completion of said compare operations by said bit compare circuits.

11. The circuit as defined by claim 10 wherein each of said bit compare circuits include an exclusive NOR compare circuit for comparing a bit of said first word to a corresponding bit of said second word.

12. The circuit as defined by claim 11 wherein said bit compare circuits include voltage dip filter means coupled to receive the output of said exclusive NOR compare circuit, said voltage dip circuit filtering out short term drops in voltage.

13. A precharge circuit, comprising:

a match line;

a match line;

inverter means coupled between a first node on said match line and a second node of said match line;

a passgate coupled between said match and match lines, said passgate including an N channel gate and a P channel gate, said passgate electrically coupling said match and match lines if a voltage of $V_{cc}$ is provided to said N channel gate of said passgate and $\overline{V_{cc}}$ is provided to said P channel gate of said passgate, said P channel gate coupled to said N channel gate of said passgate through an inverter;

a first and a second P channel transistor coupled in series between said N channel gate of said passgate and $V_{cc}$ for providing said $V_{cc}$ voltage to said N channel gate of said passgate upon the application of a BEQ signal to a gate of said first transistor and a SAE signal to a gate of said second P channel transistor;

the application of $V_{cc}$ to said N channel gate of said passgate resulting in said passgate electrically coupling said match and match lines together, and shorting $V_{cc}$ to ground, thereby precharging said match and match lines to a voltage level of $V_{cc}/2$, which is the trip point of said inverter means;

means for applying said SAE and BEQ signals during a predetermined period for precharging said match and match lines.

14. The circuit as defined by claim 13 further including match feedback circuit means coupled to said match line and to said precharge circuit.

15. The circuit as defined by claim 14 wherein said match feedback circuit means includes a third and a forth P channel transistor, said third P channel transistor coupled to $V_{cc}$ and coupled in series to said forth P channel transistor, said forth P channel transistor coupled to said match line.

16. The circuit as defined by claim 15 wherein said forth P channel transistor includes a gate coupled to said match line and said third P channel transistor includes a gate coupled to receive an SAE signal.

17. The circuit as defined by claim 16 further including a plurality of bit compare circuits coupled to said match line, each of said bit compare circuits receiving a bit from a first data word and a corresponding bit from a second data word to compare, each of said bit compare circuits comparing said bits in parallel with one another and providing an output to said match line, such that if all of said bits identically, match said match line charges up to $V_{cc}$ from precharged state of $V_{cc}/2$.

18. The circuit as defined by claim 17 wherein in the event any one of said bits do not match said match line is pulled to ground.

19. The circuit as defined by claim 18 wherein each of said bit compare circuits are coupled to said match line in a wired OR configuration.

20. The circuit as defined by claim 19 further including latching means coupled to said match line for latching the voltage state of said match line after the completion of said compare operations by said bit compare circuits.

21. The circuit as defined by claim 20 wherein each of said bit compare circuits include an exclusive NOR compare circuit for comparing a bit of said first word to a corresponding bit of said second word.

22. The circuit as defined by claim 21 wherein said bit compare circuits include voltage dip filter means coupled to receive the output of said exclusive NOR compare circuit, said voltage dip circuit filtering out short term drops in voltage.

* * * * *